(12) United States Patent
Yoshimoto et al.

(10) Patent No.: US 9,937,524 B2
(45) Date of Patent: Apr. 10, 2018

(54) METHOD FOR MANUFACTURING FLEXOGRAPHIC PRINTING PLATE AND FLEXOGRAPHIC PRINTING PLATE

(75) Inventors: Kazuya Yoshimoto, Okayama (JP); Keiichi Motoi, Okayama (JP)

(73) Assignee: TOYO BOSEKI KABUSHIKI KAISHA, Osaka-shi (JP)

( * ) Notice: Subject to any disclaimer, the term of this patent is extended or adjusted under 35 U.S.C. 154(b) by 955 days.

(21) Appl. No.: 13/516,838

(22) PCT Filed: Dec. 24, 2010

(86) PCT No.: PCT/JP2010/073294
§ 371 (c)(1),
(2), (4) Date: Jun. 18, 2012

(87) PCT Pub. No.: WO2011/081084
PCT Pub. Date: Jul. 7, 2011

(65) Prior Publication Data
US 2012/0251834 A1    Oct. 4, 2012

(30) Foreign Application Priority Data

Dec. 29, 2009  (JP) ................................ 2009-299107
Sep. 7, 2010  (JP) ................................ 2010-199647

(51) Int. Cl.
| | |
|---|---|
| *B41N 3/00* | (2006.01) |
| *B41N 1/12* | (2006.01) |
| *G03F 7/00* | (2006.01) |
| *G03F 7/033* | (2006.01) |
| *G03F 7/40* | (2006.01) |
| *B05D 5/04* | (2006.01) |
| *B41N 1/00* | (2006.01) |

(52) U.S. Cl.
CPC .............. *B05D 5/04* (2013.01); *B41N 1/003* (2013.01); *B41N 1/12* (2013.01); *B41N 3/00* (2013.01); *G03F 7/033* (2013.01); *G03F 7/405* (2013.01); *B05D 2518/10* (2013.01); *Y10T 428/31663* (2015.04)

(58) Field of Classification Search
CPC .. B41N 1/003; B41N 1/12; B41N 3/00; G03F 7/033; G03F 7/405; Y10T 428/31663; B05D 5/04; B05D 2518/10

USPC ............................. 428/427; 427/407.1, 145
See application file for complete search history.

(56) References Cited

U.S. PATENT DOCUMENTS

| | | | | |
|---|---|---|---|---|
| 5,726,241 A | * | 3/1998 | Maruyama ................ | D01F 9/22 |
| | | | | 106/287.11 |
| 2004/0067442 A1 | * | 4/2004 | Araki et al. ................... | 430/300 |
| 2007/0160933 A1 | * | 7/2007 | Onoda .................. | G03F 7/2041 |
| | | | | 430/302 |
| 2010/0310835 A1 | * | 12/2010 | Ishida .................. | C09D 129/14 |
| | | | | 428/195.1 |

FOREIGN PATENT DOCUMENTS

| | | |
|---|---|---|
| JP | 51-047805 A | 4/1976 |
| JP | 63-088555 A | 4/1988 |
| JP | 5-134410 A | 5/1993 |
| JP | 10-171111 A | 6/1998 |
| JP | 2002-292985 A | 10/2002 |
| WO | 02/44813 A1 | 6/2002 |
| WO | WO 2002/44813 A1 * | 6/2002 |
| WO | 2005/064413 A1 | 7/2005 |
| WO | WO 2005/64413 A1 * | 7/2005 |
| WO | 2007/116941 A1 | 10/2007 |

OTHER PUBLICATIONS

International Search Report of PCT/JP2010/073294, dated Feb. 8, 2011.
Extended European Search Report dated Mar. 12, 2014, issued in corresponding European application No. 10840940.0 (5 pages).

\* cited by examiner

*Primary Examiner* — William P Fletcher, III
(74) *Attorney, Agent, or Firm* — Westerman, Hattori, Daniels & Adrian, LLP

(57) ABSTRACT

Provided is a method of manufacturing a flexographic printing plate with which it is possible to prevent plate surface contamination even in the printing for long time. A method for manufacturing a flexographic printing plate, characterized in that, a liquid containing an amino-modified silicone compound is made to contact with a flexographic printing plate containing a latex having gelation degree of not less than 50% by mass. Said latex occupies preferably not less than 30% by mass of the printing resin plate, and amino group equivalent of the amino-modified silicone compound is preferably not less than 500 g/mol.

7 Claims, No Drawings

METHOD FOR MANUFACTURING FLEXOGRAPHIC PRINTING PLATE AND FLEXOGRAPHIC PRINTING PLATE

TECHNICAL FIELD OF THE INVENTION

The present invention relates to a method for manufacturing a flexographic printing plate and to a flexographic printing plate.

BACKGROUND ART

As mentioned in Patent Documents 1 to 3 for example, common photosensitive resin plates for flexography are manufactured via exposing, developing and post-exposing steps. A printing method using the photosensitive resin plate for flexography is such a method where ink is supplied onto the convex surface of uneven resin plate using an ink-supplying roll or the like and then the resin plate is made to contact with the thing to be printed so that the ink on the convex surface is transferred to the thing to be printed. In the flexography as such, adhesion of the ink to a shoulder area of the convex surface of the resin plate or invasion of the ink to the concave surface (hereinafter, it will be referred to as "plate surface contamination") often happens during the printing for long time. As a result, even the area which is not the inherent pattern area may be printed resulting in deterioration of the printing quality.

Particularly in recent years, application of flexography to a highly precise printing has been in progress and a halftone dot printing in high line numbers has been briskly carried out for creating the gradation of color and concentration. Since intervals among the halftone dots become smaller in that case, the ink is more apt to be filled in the concaves of the halftone dots of the printing plate. When the ink is accumulated in the concaves of the printing plate in a predetermined amount or more, it transfers to the thing to be printed to generate the dot bridging resulting in a significant deterioration of the printing quality.

One of the characteristics of flexography is that it can cope with various types of ink such as aqueous ink, alcoholic ink, solvent-type ink or UV ink. On the other hand, there has been a demand for preventing plate surface contamination even when any type of ink is used. It is particularly necessary to prevent plate surface contamination even if an ink having high permeability to the plate material such as solvent-type ink or UV ink is used.

Several methods have been proposed already concerning the prevention of plate surface contamination of a flexographic printing plate. For example, Patent Document 4 discloses a technique where silicone oil, silicone rubber, silicone varnish or fluorine compound is adhered, by means of brushing or spraying, onto a printing plate mainly comprising polyester resin. Although some preventing effects for plate surface contamination are available by such a technique, the plate surface contamination cannot be prevented in a halftone dot printing in high line numbers having narrow intervals among the dots. Persisting effect is also insufficient.

In Patent Document 5, there is proposed a method where a mixture of an aqueous resin and an aqueous emulsion of silicone compound or fluorine compound is applied onto a printing plate comprising an elastomer. However, due to the use of a non-modified silicone compound, an effect of preventing the plate surface contamination is not sufficient. Especially in a long-run or repeated printing, said effect hardly continues and it is necessary to apply the mixture repeatedly for maintaining the effect.

In Patent Document 6, there is proposed a method for contacting a flexographic printing plate comprising hydrophilic polymer, styrene-butadiene-styrene block copolymer, liquid butadiene, photo-cross-linking agent and photoinitiator with a solution containing a modified silicone compound. In said invention, an improvement in the effect of preventing the plate surface contamination is noted due to the use of a modified silicone compound. However, in a long-run printing, plate surface contamination is generated and, particularly when a solvent-type ink and UV ink are used, its persisting effect is not sufficient. In said invention, there is also mentioned a method where active ray is irradiated after contacting a modified silicone compound with the plate but the persisting effect is not sufficient in such a case as well.

In Patent Document 7, there is disclosed a method where an organosilicon compound is made to contain in a printing plate comprising block copolymer, photo-cross-linking agent and photoinitiator. In that method, silicone is made to contain in a resin composition and an excellent persisting effect is achieved as compared with a method where silicone solution is contacted with a plate surface. However, the organosilicon compound is spread into the entire printing plate composition and amount of silicone existing on the printing plate surface is small. Therefore, the effect of preventing the clogging of ink which is crucial is not sufficient. Deterioration of adhesion of resin layer to base film is also resulted and a serious disadvantage of detachment of base film and resin layer during the printing may happen.

PRIOR ART DOCUMENTS

Patent Documents

Patent Document 1: Japanese Patent Application Laid-Open (JP-A) No. 171111/98
Patent Document 2: Japanese Patent Application Laid-Open (JP-A) No. 88555/88
Patent Document 3: Japanese Patent Application Laid-Open (JP-A) No. 134410/93
Patent Document 4: Japanese Patent Application Laid-Open (JP-A) No. 47805/76
Patent Document 5: Japanese Patent Application Laid-Open (JP-A) No. 2002-292985
Patent Document 6: WO 2005/064413
Patent Document 7: WO 2007/116941

DISCLOSURE OF THE INVENTION

Problem that the Invention is to Solve

The object of the present invention is to provide a method for manufacturing a printing plate which can prevent the plate surface contamination for a long period.

Means for Solving the Problem

The present inventors have carried out intensive investigations for achieving such an object and found that, when a liquid containing an amino-modified silicone compound is made to contact with a flexographic printing plate containing a latex having gelation degree of not less than 50% by mass, the above-mentioned problem is solved whereupon the present invention has been accomplished. The present invention has been achieved by the result of our intensive investigations from both views of a printing plate composition and a silicone compound.

Thus, the constitution of the present invention is as follows.

(1) A method for manufacturing a flexographic printing plate, characterized in that, a liquid containing an amino-modified silicone compound is made to contact with a flexographic printing plate containing a latex having gelation degree of not less than 50% by mass.

(2) The manufacturing method according to (1), wherein content of the latex having gelation degree of not less than 50% by mass is not less than 30% by mass in a printing plate resin composition.

(3) The manufacturing method according to (1) or (2), wherein the flexographic printing plate further contains an emulsifier.

(4) The manufacturing method according to (3), wherein the emulsifier is an anionic surfactant.

(5) The manufacturing method according to (1) to (4), wherein an amino-modified silicone compound having amino group equivalent of not less than 500 g/mol is used.

(6) A flexographic printing plate manufactured by any of the manufacturing methods of (1) to (5).

Advantages of the Invention

In the flexographic printing plate prepared by the manufacturing method of the present invention, no plate surface contamination is generated even in the printing for long time using a solvent-type ink and printing in high quality can be conducted for long time in a stable manner.

BEST MODE FOR CARRYING OUT THE INVENTION

As hereunder, the present invention will be illustrated mainly for the preferred embodiments thereof.

The present inventors have achieved, as a result of intensive investigations in both views of a printing plate resin composition and a silicone compound, development of a method for preventing the plate surface contamination having an excellent persisting effect. Thus, as a printing plate resin composition, a latex having gelation degree of not less than 50% by mass is made to contain therein and, as a silicone compound, that which contains amino group is used.

Firstly, the resin composition constituting the printing plate will be illustrated. As to the resin composition constituting the printing plate, it is preferred to contain a latex (A) having gelation degree of not less than 50% by mass as an essential ingredient and further contain an photopolymerizable compound (B) and a photoinitiator (C).

It is essential that the printing plate used in the present invention contains the latex (A) having gelation degree of not less than 50% by mass. The latex (A) may comprise a latex of a single kind or comprise a mixture of plurality of latices. As a result of the use of the latex having gelation degree of not less than 50% by mass, persistency of the effect for preventing the plate surface contamination is significantly improved. It is preferred to use the latex having gelation degree of not less than 70% by mass. On the contrary, when the latex having gelation degree of less than 50% by mass is used or when no latex is used, persistency of the effect for preventing the plate surface contamination is significantly deteriorated.

In the present invention, value of gelation degree of the latex (A) is stipulated by its insolubility degree in toluene. To be more specific, about 3 g of a latex solution was applied on a precisely-weighed PET film of 100 μm thickness, dried at 100° C. for 1 hour, precisely weighed, dipped in a toluene solution of 25° C. for 48 hours, dried at 110° C. for 2 hours and precisely weighed again, then the mass fraction (unit: % by mass) of the matter being insoluble in toluene in the latex solid content was calculated and the resulting value was adopted as the gelation degree of the latex in the present invention.

As the latex (A) to be used in the present invention, a latex having gelation degree of a certain level or higher may be selected appropriately from among conventional latices. For example, a polybutadiene latex, a styrene-butadiene copolymer latex, an acrylonitrile-butadiene copolymer latex, a methyl methacrylate-butadiene copolymer latex, etc. can be used. Further, these latices may have been modified with (meth)acrylate, carboxy, etc. Here, because a variety of synthetic latex and natural latex as gelled latices are on the market, a proper one may be selected from among them as a gelled latex.

It is preferred that the latex used in the present invention contains an emulsifier. An emulsifier is a compound having, for example, a hydrophobic group such as long-chain alkyl group and a hydrophilic group such as carboxylate in a molecule and stands for a compound or a composition exhibiting an emulsifying action. As to the emulsifier, there may be used anionic surfactant, nonionic surfactant, cationic surfactant, macromolecular surfactant or a mixture thereof. Examples of the anionic surfactant include higher fatty acid salt, alpha-olefin sulfonate, alkyl benzenesulfonate, alkyl sulfate salt, alkyl ether sulfate salt, methyl taurinate and sulfosuccinate. Examples of the nonionic surfactant include adduct of higher alcohol with ethylene oxide, adduct of alkylphenol with ethylene oxide, adduct of fatty acid with ethylene oxide, adduct of polyhydric alcohol fatty acid ester with ethylene oxide, adduct of higher alkylamine with ethylene oxide and adduct of fatty acid amide with ethylene oxide. Surfactant of a polyethylene glycol type such as adduct of polypropylene glycol with ethylene oxide and surfactant of a polyhydric alcohol type such as glycerol fatty acid ester, pentaerythritol fatty acid ester, fatty acid ester of sorbitol and sorbitan, alkyl ester of polyhydric alcohol and fatty acid amide of alkanolamine are also examples of the nonionic surfactant. Examples of cationic surfactant include acylaminoethyl diethylamine salt, N-alkyl polyalkylenepolyamine salt, fatty acid polyethylenepolyamide salt, diethylaminoethylamide salt, alkyl trimethylammonium salt, dialkyl dimethylammonium salt and alkyl dimethylammonium salt. Examples of the macromolecular surfactant include acryl resin containing a hydrophilic group in a molecule. As to such emulsifiers, one kind thereof may be used solely or two or more kinds thereof may be used by mixing them.

A plate material using latex containing an emulsifier is excellent in a persisting effect for water repellency and hardly results in dot bridging even after printing for long time. A plate material using the latex in which anionic surfactant is used as an emulsifier is particularly excellent in a persisting effect of water repellency and is also excellent in view of prevention of dot bridging.

The photopolymerizable compound (B) has a role to polymerize and crosslink by light irradiation, thereby forming a dense network in a printing plate for shape maintenance. A photopolymerizable oligomer is preferred as the photopolymerizable compound (B) used in the present invention. The term reading a photopolymerizable oligomer used here is a conjugated diene-based ethylenic polymer where an ethylenic unsaturated group binds to terminal and/or side chain of a conjugated diene-based polymer and which has a number average molecular weight of 1,000 to 10,000.

The conjugated diene-based polymer which constitutes the conjugated diene-based ethylenic polymer is formed of a homopolymer of a conjugated diene unsaturated compound or a copolymer of a conjugated diene unsaturated compound and a monoethylenically unsaturated compound. Examples of such a homopolymer of a conjugated diene unsaturated compound or a copolymer of a conjugated diene unsaturated compound and a monoethylenically unsaturated compound include a butadiene polymer, an isoprene polymer, a chloroprene polymer, a styrene-chloroprene copolymer, an acrylonitrile-butadiene copolymer, an acrylonitrile-isoprene copolymer, a methyl methacrylate-chloroprene copolymer, a methyl acrylate-butadiene copolymer, a methyl acrylate-isoprene copolymer, a methyl acrylate-chloroprene copolymer, an acrylonitrile-butadiene-styrene copolymer and an acrylonitrile-chloroprene-styrene copolymer. Among these, a butadiene polymer, an isoprene polymer and an acrylonitrile-butadiene copolymer are preferable, and a butadiene polymer and an isoprene polymer are particularly preferable from the viewpoint of rubber elasticity and photocurability.

With regard to the photopolymerizable compound of the present invention, there may be used, if necessary, a commonly used photopolymerizable compound such as acrylate or methacrylate in addition to the above-exemplified ones within such an extent that the effect of the present invention is not deteriorated thereby.

The photopolymerization initiator (C) has a role as a catalyst for photopolymerization and crosslinking reaction of the photopolymerizable compound. While any compound capable of causing a polymerizable carbon-carbon unsaturated group to polymerize by light irradiation can be used as the photopolymerization initiator used in the present invention, a compound which has a function of generating a radical through self decomposition or hydrogen extraction caused by light absorption is used preferably. Specifically, benzoin alkyl ethers, benzophenones, anthraquinones, benzyls, acetophenones, diacetyls and the like, for example, can be used.

In the resin composition constituting the printing plate of the present invention, although there is no particular limitation for the compounding amount of the latex (A) having gelation degree of not less than 50% by mass, it is preferred that not less than 30% by mass is contained therein. As a result of containing not less than 30% by mass, the preventing effect for the plate surface contamination is particularly excellent. It is more preferred when not less than 40% by mass is made to contain. On the other hand, upper limit of the compounding amount of the latex is preferred to be less than 70% by mass. When it is more than 70% by mass, deterioration in the photopolymerization cross-linking property is noted and formation of a highly precise image is difficult.

In the resin composition constituting the printing plate of the present invention, optional components such as an elastomer, a hydrophillic polymer, a plasticizer and/or a polymerization inhibitor may be incorporated, if desired, in addition to the aforementioned three components (A) to (C).

There are some cases where improvement in the printing resistance and in the handling property before exposure of the printing plate of the present invention is noted when an elastomer is compounded with the printing plate of the present invention. With regard to the elastomer having such an effect, there are a polymer prepared by polymerization of a conjugated diene-based hydrocarbon and a copolymer prepared by polymerization of a conjugated diene-based hydrocarbon with a monoolefin-based unsaturated compound and examples thereof include butadiene polymer, isoprene polymer, chloroprene polymer styrene-butadiene copolymer, styrene-isoprene copolymer, styrene-isoprene-styrene copolymer, styrene-chloroprene copolymer, acrylonitrile-butadiene copolymer, acrylonitrile-isoprene copolymer, methyl methacrylate-butadiene copolymer, methyl methacrylate-butadiene copolymer, methyl methacrylate-isoprene copolymer and acrylonitrile-isoprene-styrene copolymer. Each of those elastomers may be used solely or two or more thereof may be used jointly.

There may be the case where an effect of enhancing the developing property of the printing plate of the present invention by water is recognized when a hydrophilic polymer is compounded with the printing plate of the present invention. Hydrophilic polymers which achieve such an effect preferably include polymers having a hydrophilic group such as —COOH, —COOM (M is a monovalent, divalent or trivalent metal ion or a substituted or unsubstituted ammonium ion), —OH, —NH$_2$, —SO$_3$H and a phosphate group, and specifically include a polymer of (meth) acrylic acid or salts thereof, a copolymer of (meth)acrylic acid or salts thereof with an alkyl (meth)acrylate, a copolymer of (meth)acrylic acid or salts thereof with styrene, a copolymer of (meth)acrylic acid or salts thereof with vinyl acetate, a copolymer of (meth)acrylic acid or salts thereof with acrylonitrile, polyvinyl alcohol, carboxymethylcellulose, polyacrylamide, hydroxyethylcellulose, polyethylene oxide, polyethyleneimine, polyurethane which has a —COOM group, polyurea urethane which has a —COOM group, polyamide acid which has a —COOM group, and salts or derivatives thereof. These may be used solely or two or more polymers may be used in combination. The compounding proportion of the hydrophillic polymer in the resin composition constituting the printing plate of the present invention is preferably 20% by mass or less, and more preferably 15% by mass or less. If the compounding amount of the hydrophilic polymer exceeds the upper limit shown above, a printing plate to be produced may deteriorate in water resistance and deteriorate in water-based ink resistance.

There are some cases where an effect of improving the fluidity of a resin composition constituting the printing plate of the present invention and an effect of adjusting the hardness of a printing original plate to be produced are achieved when a plasticizer is compounded with the printing plate of the present invention. The plasticizer which achieves such effects is preferably a product which is good in compatibility with the latex (A), and more preferably a polyene compound which is liquid at room temperature or a compound having an ester linkage which is liquid at room temperature. Examples of the polyene compound which is liquid at room temperature are liquid polybutadiene, polyisoprene, and their maleinated derivatives and epoxidized derivatives resulting from modification of their terminal groups or side chains. Examples of the compound having an ester linkage which is liquid at room temperature include phthalates, phosphates, sebacates, adipates and polyesters having molecular weight of 1,000 to 3,000. The compounding proportion of the plasticizer in the resin composition of the present invention is preferably 30% by mass or less, and more preferably 20% by mass or less. If the compounding amount of the plasticizer exceeds the upper limit shown above, a printing plate may deteriorate greatly in mechanical properties and solvent resistance and may deteriorate printing durability.

The polymerization inhibitor has an effect of increasing the thermal stability of a resin composition constituting the printing plate of the present invention. In the resin composition constituting the printing plate of the present invention, conventionally known polymerization inhibitors can be used, and examples thereof include phenols, hydroquinones and catechols. The compounding proportion of the polymerization inhibitor in the resin composition constituting the printing plate of the present invention is preferably 0.001 to 3% by weight, and more preferably 0.001 to 2% by weight.

Moreover, a colorant, an antioxidant, a silicone compound, a fluorine compound etc. may also be added as optional components other than those mentioned above, unless the effect of the present invention is impaired.

The resin composition of the present invention is prepared by compounding with latex (A) having gelation degree of not less than 50% by weight as an essential ingredient and, if desired, by mixing with photopolymerizable compound, photoinitiator and optional ingredient. In this operation, an organic solvent such as toluene may be added, if desired, in order to make the mixing easier. Further, in order to mix completely, it is desirable to fully knead the components under a heating condition using a kneader. The heating condition is preferably about 50 to about 110° C. Further, the moisture contained in the organic solvent added at the time of mixing and in the components is preferably removed under reduced pressure after the kneading.

Now, an amino-modified silicone compound will be illustrated.

The amino-modified silicone compound used in the present invention has at least one amino group in a molecule. There is no particular limitation for the position of the amino group and examples thereof include terminal position and side chain position. The amino group may exist at plural positions. Further, a functional group other than the amino group may be contained therein. As a result of the use of an amino-modified silicone, not only the ink repelling effect in the initial stage is excellent but also a very excellent persisting property of the effect is available even under the condition where a solvent-type ink is used.

When silicone compound having no modifying group such as silicone oil having dimethylsiloxane as a main chain is used, the ink repelling effect is poor already in the initial stage of contacting with the plate and, moreover, the effect is completely lost in the initial stage of printing. In the case of a modified silicone compound having no amino group but having a functional group such as methacrylic group, carbinol group or carboxyl group, although the ink repelling effect is better as compared with the case where no modifying group is present, the effect lowers in the printing for long time.

The amino group equivalent of the amino-modified silicone compound is preferred to be within a range of 500 g/mol to 20,000 g/mol and more preferred to be within a range of 1,000 g/mol to 10,000 g/mol. When the amino group equivalent is made not less than 500 g/mol, an excellent ink repelling effect in the initial stage is achieved. On the other hand, when it is made less than 20,000/mol, persistence of the effect is excellent.

Although there is no particular limitation for the dynamic viscosity of the amino-modified silicone compound, the range of 20 to 5,000 mm$^2$/s is preferred and the range of 40 to 1,000 mm$^2$/s is more preferred. When it is made not less than 20 mm$^2$/s, the ink repelling property is particularly excellent. On the other hand, when it is made less than 5,000 mm$^2$/s, the stability upon dissolution is particularly excellent.

With regard to the amino-modified silicone compound which can be used in the present invention, such one as shown below is available in the market. Thus, examples thereof include KF859, KF393, KF860, KF880, KF8004, KF867, KF869, KF861, KF877, X22-3939A, PAM-E, KF8010, X22-161A, KF8012, KF8008, X22-1660B-3, KF857, KF8001, KF862, X22-9192 and KF858 manufactured by Shin-Etsu Chemical and L652, L653, L655, L656, WR1100, WR1200, WR1300, WR1600, WT1250 and WT1650 manufactured by Asahi Kasei-Wacker Silicone. Among them, KF859, KF860, KF880, X22-161A, KF8012, KF8001, L653 and WT1250 are particularly preferred in view of functional group equivalent and dynamic viscosity.

In the present invention, an amino-modified silicone compound of an emulsion type can also be used. For example, the following products are available in the market. Examples thereof include PolonMF-14, PolonMF-14D, PolonMF-14EC, PolonMF-29, PolonMF-44 and PolonMF-52, manufactured by Shin-Etsu Chemical and FINISH CT14E, FINISH CT15E, KP2601, NP2609, TS2403, SLJ1316, SLJ1367, SLJ1358 and SMK2101J manufactured by Asahi Kasei-Wacker Silicone.

With regard to a method for contacting a printing plate with amino-modified silicone compound, any method will be applicable. For example, there is a method where a treating solution is previously prepared by dissolving or dispersing the amino-modified silicone compound in organic solvent, water or alcohol, preferably in an alcohol having 1 to 6 carbon(s) or, more preferably, in methanol, ethanol, isopropyl alcohol or the like and then, at an appropriate stage after the exposing step, the printing plate is dipped in a treating solution or the treating solution is applied onto the plate surface using atomizer, sprayer, brush or the like. Concentration of the silicone compound used in such a treating solution is within a range of 0.05% by mass to 10% by mass. If necessary, to the solution containing the amino-modified silicone compound, it is also possible to add a solvent such as glycerol or alkyl glycol ether for enhancing the permeability to the plate or to use acidic compound (such as formic acid or acetic acid), glycerol, surfactant, etc. for enhancing the dissolving stability of the amino-modified silicone. It is further possible to use a silane coupling agent together therewith.

After contacting the amino-modified silicone compound solution with the printing plate, it is preferred to conduct a drying/heating treatment at not lower than 40° C. It is more preferred to conduct a drying/heating treatment at the temperature of not lower than 50° C. Drying time is preferred to be not shorter than 5 minutes and more preferred to be not shorter than 10 minutes. As a result of conducting the heating treatment step as such, close adherence force of the amino-modified silicone compound with the printing plate becomes stronger.

Although the step for contacting the printing plate with the amino-modified silicone may be in any stage provided that it is after the main exposing step, it is preferred to be immediately after the developing step. That is because, in the common flexographic engraving step, drying is conducted after the developing and, when a printing plate is contacted with a silicone solution after the developing, it is now possible to simultaneously conduct the drying of a developer and the drying/heating treatment of a silicone solution whereby the steps can be simplified.

In case an automatic developing machine of an inline type is used, two steps of "developing" and "spraying of silicone solution" can be carried out in one device. It is also possible that a silicone compound is made to contain in a rinsing solution after the developing.

Another example of a method for contacting a printing plate with a silicone solution is a method where an amino-modified silicone compound is mixed with a developer used in a developing step for a photosensitive resin plate. Besides the above, the developer usually contains anionic surfactant, nonionic surfactant, cationic surfactant, defoaming agent, alkali agent, etc. In addition thereto, various stabilizers may also be compounded therewith for enhancing the stability of the amino-modified silicone compound in the developer.

In the present invention, a printing plate containing a gelled latex is made to contact with an amino-modified silicone compound whereupon persistency of an excellent preventing effect for plate surface contamination is achieved. Although the action mechanism of the effect has not been clarified yet, it is presumed that an interaction between the amino-modified silicone compound and the gelled latex and/or an interaction between the amino-modified silicone compound and the emulsifier play(s) an important role. It is presumed that, since the gelled latex is three-dimensionally cross-linked, the gelled latex is hardly swollen even when an ink solvent is permeated therein once the amino-modified silicone is incorporated in a matrix of the gelled latex and, as a result, the amino-modified silicone is hardly detached from the gelled latex whereby there is achieved an excellent persisting effect for preventing plate surface contamination. Further, it has been recognized in a plate material using a latex wherein an anionic surfactant is used as an emulsifier that a persisting effect in water repellency is particularly excellent and that prevention of dot bridging is also excellent. It is presumed that, as a result of a strong interaction between an amino group of the amino-modified silicone and an anionic group of the anionic surfactant, the amino-modified silicone is hardly detached whereby there is achieved an excellent persisting effect for preventing the plate surface contamination.

It has been also found that the printing plate of the present invention has such an advantageous effect which has not been disclosed in prior art documents that printing durability is enhanced as compared with the printing plate which is not subjected to a treatment with an amino-modified silicone. Usually, in a printing plate using a gelled latex, fine dots are cracked or abraded by a long-term contact with an anilox roll and a thing to be printed during a long-run printing due to the fact that latex is present in a form of particles whereby the printing durability has not been always satisfactory. Against the above, in case an amino-modified silicone is made to contact with the printing plate, abrasion and crack of fine dots are hardly generated even during the long-run printing whereby the printing durability could be enhanced. Although the action mechanism of this effect has not been clarified yet, it is presumed to be caused by a lowering of abrasive force of the plate surface by conducting a treatment with an amino-modified silicone and/or by a decrease in penetration of an ink solvent into the inner area of the plate due to an improvement in the ink repelling property of the plate.

EXAMPLES

The present invention will now be further illustrated by way of the following Examples although the present invention is not limited thereto.

"Evaluation of Surface Tension"

Surface tension was evaluated using a mixed solution for testing a wetting tension (manufactured by Kanto Kagaku). Under the atmosphere of 20° C. and 60 RH %, two drops of each of 22.6 mN/m, 25.4 mN/m, 27.3 mN/m, 30 mN/m, 31 mN/m, 32 mN/m, 33 mN/m, 34 mN/m, 35 mN/m, 36 mN/m, 37 mN/m, 38 mN/m, 39 mN/m and 40 mN/m mixed solutions for testing a wetting tension were dropped onto a printing plate and the spread wetting upon spreading by a cotton swab was evaluated by naked eye. The value of the mixed solution when liquid was repelled was adopted as surface tension. When the surface tension is lower, the property of repelling the ink is higher and the preventive effect for ink clogging during the printing is higher.

"Evaluation of Dot Bridging"

Dot bridging was evaluated by a flexographic printer FPR 302 (manufactured by MCK) using anilox of 800 LPI. As to an ink, a solvent ink (trade name: Brightflex (manufactured by DIC)) was used. As to a thing to be printed, a coat paper (trade name: Pearl Coat (manufactured by Oji Paper)) was used. Printing was conducted at the speed of 50 m/minute. Under the above conditions, a 50-m printing was at first carried out and a printed sample was collected. After that, a 950-m printing was conducted and a sample after printing for 1000 m in total was prepared. The halftone dots to be evaluated were those of 1, 5, 10 and 20% at 125, 150, 175 and 200 LPI and the dot bridging was evaluated thereby. When the dot bridging was not observed at all, when it was generated at the terminals of the halftone dots, when it was generated near the terminals of the halftone dots and when it was generated on all surfaces of the halftone dots, they are evaluated as "A", "B", "C" and "D", respectively.

"Evaluation of Printing Durability"

Printing durability was evaluated by a flexographic printer FPR 302 (manufactured by MCK) using anilox of 800 LPI. As to an ink, a solvent ink (trade name: Brightflex (manufactured by DIC)) was used. As to a thing to be printed, a coat paper (trade name: Pearl Coat (manufactured by Oji Paper)) was used. Printing was conducted at the speed of 50 m/minute. For a purpose of accelerating the evaluation of printing durability, the printing pressure was conducted under a condition of pressing to an extent of 0.02 mm from the proper value. Printed quantity until cracks or abrasions were generated in the halftone dots of 200 LPI 1% and deterioration in the printing quality was noted was evaluated.

Synthetic Example 1

125 parts by mass of styrene-butadiene latex (Cyatex NA-11 manufactured by Nippon A&L; solid concentration: 40%; anionic surfactant is used as an emulsifier) as latex;

15 parts by mass of oligobutadiene acrylate (ABU-3 manufactured by Kyoeisha Kagaku; molecular weight: 2,700), 10 parts by mass of lauryl methacrylate and 10 parts by mass of trimethylolpropane triacrylate as photopolymerizable compounds;

1 part by mass of benzyl dimethylketal as a photopolymerization initiator and 20 parts by mass of PFT-3 (a compound of molecular weight of ca. 20,000 having a urethaneurea structure manufactured by Kyoeisha Kagaku; solid concentration: 25%) as a hydrophilic polymer, 0.1 part by mass of hydroquinone monomethyl ether as a polymerization inhibitor and 9 parts by mass of liquid butadiene rubber as a plasticizer were mixed in a container together with 5 parts by mass of toluene and kneaded at 105° C. using a pressurizing kneader and, after that, toluene and water were removed therefrom in vacuo to give a resin composition 1.

Synthetic Example 2

A resin composition 2 was prepared by the same method as in Synthetic Example 1 except that 91 parts by mass of butadiene latex (LX111NF manufactured by Nippon Zeon; solid concentration: 55%; anionic surfactant is used as an emulsifier) was used instead of 125 parts by mass of styrene-butadiene latex (Cyatex NA-11 manufactured by Nippon A&L; solid concentration: 40%; anionic surfactant is used as an emulsifier).

Synthetic Example 3

A resin composition 3 was prepared by the same method as in Synthetic Example 1 except that 125 parts by mass of NBR latex (Cyatex NA-10 manufactured by Nippon A&L; solid concentration: 40%; anionic surfactant is used as an emulsifier) was used instead of 125 parts by mass of styrene-butadiene latex (Cyatex NA-11 manufactured by Nippon A&L; solid concentration: 40%; anionic surfactant is used as an emulsifier).

Synthetic Example 4

A resin composition 4 was prepared by the same method as in Synthetic Example 1 except that 71 parts by mass of styrene-butadiene latex (C4850 manufactured by Nippon Zeon; solid concentration: 70%; anionic surfactant is used as an emulsifier) was used instead of 125 parts by mass of styrene-butadiene latex (Cyatex NA-11 manufactured by Nippon A&L; solid concentration: 40%; anionic surfactant is used as an emulsifier).

Synthetic Example 5

A resin composition 5 was prepared by the same method as in Synthetic Example 1 except that 100 parts by mass of NBR latex (Cyatex NA-105S manufactured by Nippon A&L; solid concentration: 50%; anionic surfactant is used as an emulsifier) was used instead of 125 parts by mass of styrene-butadiene latex (Cyatex NA-11 manufactured by Nippon A&L; solid concentration: 40%; anionic surfactant is used as an emulsifier).

Synthetic Example 6

A resin composition 6 was prepared by the same method as in Synthetic Example 1 except that 119 parts by mass of NBR latex (SX1503A manufactured by Nippon Zeon; solid concentration: 42%; acrylic macromolecular surfactant is used as an emulsifier) was used instead of 125 parts by mass of styrene-butadiene latex (Cyatex NA-11 manufactured by Nippon A&L; solid concentration: 40%; anionic surfactant is used as an emulsifier).

Synthetic Example 7

A resin composition 7 was prepared by the same method as in Synthetic Example 1 except that 50 parts by mass of butadiene polymer (BR02 manufactured by Japan Synthetic Rubber; solid concentration: 100%) was used instead of 125 parts by mass of styrene-butadiene latex (Cyatex NA-11 manufactured by Nippon A&L; solid concentration: 40%; anionic surfactant is used as an emulsifier).

Synthetic Example 8

A resin composition 8 was prepared by the same method as in Synthetic Example 1 except that a mixture of 75 parts by mass of styrene-butadiene latex (Cyatex NA-11 manufactured by Nippon A&L; solid concentration: 40%; anionic surfactant is used as an emulsifier) and 20 parts by mass of butadiene polymer (BR02 manufactured by Japan Synthetic Rubber; solid concentration: 100%) was used instead of 125 parts by mass of styrene-butadiene latex (Cyatex NA-11 manufactured by Nippon A&L; solid concentration: 40%; anionic surfactant is used as an emulsifier).

Synthetic Example 9

A resin composition 9 was prepared by the same method as in Synthetic Example 1 except that a mixture of 25 parts by mass of styrene-butadiene latex (Cyatex NA-11 manufactured by Nippon A&L; solid concentration: 40%; anionic surfactant is used as an emulsifier) and 40 parts by mass of butadiene polymer (BR02 manufactured by Japan Synthetic Rubber; solid concentration: 100%) was used instead of 125 parts by mass of styrene-butadiene latex (Cyatex NA-11 manufactured by Nippon A&L; solid concentration: 40%; anionic surfactant is used as an emulsifier).

Example 1

A resin composition 1 obtained in Synthetic Example 1 was sandwiched between a support composed of a polyethylene terephthalate film having a thickness of 125 μm coated with a polyester-based adhesive layer and a cover film composed of a polyethylene terephthalate film having a thickness of 100 μm coated with an anti-adhesive layer comprising polyvinyl alcohol so that the adhesive layer and the anti-adhesive layer could come into contact with the resin composition, and then pressed with a heat pressing machine at 105° C. for 1 minute at a pressure of 10 MPa, thereby obtaining a sheet-like photosensitive resin plate having a thickness of 1.14 mm. This photosensitive resin plate was firstly subjected to a total-surface exposure of 300 mJ/cm$^2$ from the support side using a UV exposure device (10R manufactured by Philips) and then the cover film on the opposite side was removed followed by subjecting to an image exposure of 4,000 mJ/cm$^2$ via a negative film. Developing was then conducted for 7 minutes using a washing-out device (CRS 600 manufactured by Toyobo; 1% aqueous solution of washing soap of 40° C.). After that, water drops on the plate surface were removed using a water straining rod. Then an ethanolic solution containing 0.4% by weight of an amino-modified silicone compound (KF859 manufactured by Shin-Etsu Chemical; amino group equivalent: 6,000 g/mol; dynamic viscosity: 60 mm$^2$/s) was sprayed thereon using a sprayer. After that, drying was conducted using a drier of 60° C. for 10 minutes and then post exposure (10R manufactured by Philips; 4,000 mJ/cm$^2$) and treatment with a sterilizing lamp (for 5 minutes) were conducted to give the aimed printing plate. Result of the evaluation is shown in Table 1.

Example 2

The same evaluation as in Example 1 was conducted using the resin composition 2 prepared in Synthetic Example 2. Result of the evaluation is shown in Table 1.

Example 3

The same evaluation as in Example 1 was conducted using the resin composition 3 prepared in Synthetic Example 3. Result of the evaluation is shown in Table 1.

Example 4

The same evaluation as in Example 1 was conducted using the resin composition 4 prepared in Synthetic Example 4. Result of the evaluation is shown in Table 1.

Comparative Example 1

The same evaluation as in Example 1 was conducted using the resin composition 5 prepared in Synthetic Example 5. Result of the evaluation is shown in Table 1.

Comparative Example 2

The same evaluation as in Example 1 was conducted using the resin composition 6 prepared in Synthetic Example 6. Result of the evaluation is shown in Table 1.

Comparative Example 3

The same evaluation as in Example 1 was conducted using the resin composition 7 prepared in Synthetic Example 7. Result of the evaluation is shown in Table 1.

Example 5

The same evaluation as in Example 1 was conducted using the resin composition 8 prepared in Synthetic Example 8. Result of the evaluation is shown in Table 1.

Example 6

The same evaluation as in Example 1 was conducted using the resin composition 9 prepared in Synthetic Example 9. Result of the evaluation is shown in Table 1.

Example 7

The same evaluation as in Example 1 was conducted except that an amino-modified silicone (KF393 manufactured by Shin-Etsu Chemical; functional group equivalent: 350 g/mol; dynamic viscosity: 70 mm$^2$/s) was used as a silicone compound. Result of the evaluation is shown in Table 1.

Example 8

The same evaluation as in Example 1 was conducted except that an amino-modified silicone (L656 manufactured by Asahi Kasei-Wacker Silicone; functional group equivalent: 800 g/mol; dynamic viscosity: 25 mm$^2$/s) was used as a silicone compound. Result of the evaluation is shown in Table 1.

Example 9

The same evaluation as in Example 1 was conducted except that an amino-modified silicone (KF880 manufactured by Shin-Etsu Chemical; functional group equivalent: 1,800 g/mol; dynamic viscosity: 650 mm$^2$/s) was used as a silicone compound. Result of the evaluation is shown in Table 1.

Comparative Example 4

The same evaluation as in Example 1 was conducted except that a carboxy-modified silicone (X22-162C manufactured by Shin-Etsu Chemical; functional group equivalent: 2,300 g/mol; dynamic viscosity: 220 mm$^2$/s) was used as a silicone compound. Result of the evaluation is shown in Table 1.

Comparative Example 5

The same evaluation as in Example 1 was conducted except that a methacryl-modified silicone (X22-164A manufactured by Shin-Etsu Chemical; functional group equivalent: 860 g/mol; dynamic viscosity: 25 mm$^2$/s) was used as a silicone compound. Result of the evaluation is shown in Table 1.

Comparative Example 6

The same evaluation as in Example 1 was conducted except that a non-modified silicone (KF96-50CS manufactured by Shin-Etsu Chemical; dynamic viscosity: 50 mm$^2$/s) was used as a silicone compound. Result of the evaluation is shown in Table 1.

Comparative Example 7

Contact of a silicone compound with a printing plate was not carried out. The same evaluation as in Example 1 was conducted except the above. Result of the evaluation is shown in Table 1.

It will be apparent from Table 1 that, when an amino-modified compound was made to contact with a printing plate containing a latex having gelation degree of not less than 50% by mass, there was prepared a printing plate causing no dot bridging at all even after printing for long time. On the contrary, in a printing plate using the latex of low gelation degree or using no latex as shown in Comparative Examples 1, 2 and 3, the ink repelling effect significantly lowered during the printing and the dot bridging was terrible. Further, in case a silicone compound having no amino group was used as shown in Comparative Examples 4, 5 and 6, lowering in an ink repelling effect was noted in a long-run printing and the dot bridging became bad as well. It is apparent from the above that, when a printing plate containing a latex having gelation degree of not less than 50% by mass was made to contact with an amino-modified silicone compound, an excellent water repelling effect can be persisted for long time and a dot bridging can be prevented.

TABLE 1

| | resin composition | | | | surface tension (mN/m) | | dot bridging | | |
|---|---|---|---|---|---|---|---|---|---|
| | | used latex | | | | | | | |
| | | gelation | latex | | | | | | |
| | resin composition number | degree (% by mass) | content (% by mass) | silicone compound | initial stage of printing | after printing | initial stage of printing | after printing | evaluation of printing durability |
| Example 1 | 1 | 95 | 50 | amino-modified silicone compound KF859 | 25 | 25 | A | A | >1000 m |
| Example 2 | 2 | 86 | 50 | amino-modified silicone compound KF859 | 25 | 25 | A | A | >1000 m |
| Example 3 | 3 | 75 | 50 | amino-modified silicone compound KF859 | 25 | 25 | A | A | >1000 m |
| Example 4 | 4 | 60 | 50 | amino-modified silicone compound KF859 | 25 | 27 | A | B | >1000 m |
| Comparative Example 1 | 5 | 35 | 50 | amino-modified silicone compound KF859 | 25 | 34 | A | C | 800 m |
| Comparative Example 2 | 6 | 0 | 50 | amino-modified silicone compound KF859 | 25 | 40 | A | D | not evaluated |
| Comparative Example 3 | 7 | not containing latex | | amino-modified silicone compound KF859 | 25 | 40 | B | D | >1000 m |
| Example 5 | 8 | 95 | 30 | amino-modified silicone compound KF859 | 25 | 27 | A | A | >1000 m |
| Example 6 | 9 | 95 | 10 | amino-modified silicone compound KF859 | 25 | 30 | A | B | not evaluated |
| Example 7 | 1 | 95 | 50 | amino-modified silicone compound KF393 | 27 | 27 | B | B | >1000 m |
| Example 8 | 1 | 95 | 50 | amino-modified silicone compound L656 | 25 | 27 | A | B | >1000 m |
| Example 9 | 1 | 95 | 50 | amino-modified silicone compound KF880 | 25 | 25 | A | A | >1000 m |
| Comparative Example 4 | 1 | 95 | 50 | carboxy-modified silicone compound X22-162C | 27 | 35 | B | C | 700 m |
| Comparative Example 5 | 1 | 95 | 50 | methacryl-modified silicone compound X22-164A | 30 | 35 | B | C | 600 m |
| Comparative Example 6 | 1 | 95 | 50 | non-modified silicone compound KF96-50CS | 33 | 40 | C | D | 500 m |
| Comparative Example 7 | 1 | 95 | 50 | none | 40 | 40 | D | D | 500 m |

INDUSTRIAL APPLICABILITY

In accordance with the manufacturing method of the present invention, a preventing effect for a plate surface contamination with excellent persistency can be imparted to a flexographic printing plate. As a result thereof, it is now possible to carry out the printing of high quality in a stable manner for a long period and it greatly contributes in industry.

The invention claimed is:

1. A method for manufacturing a flexographic printing plate, characterized in that, a liquid containing an amino-modified silicone compound is made to contact with a flexographic printing plate containing a latex having gelation degree of not less than 50% by mass,
   wherein the amino-modified silicone compound having amino group equivalent of not less than 1800 g/mol is used, and
   wherein dot bridging at initial stage of printing and after printing of the flexographic printing plate is not observed.

2. The manufacturing method according to claim 1, wherein content of the latex having gelation degree of not less than 50% by mass is not less than 30% by mass in a printing plate resin composition.

3. The manufacturing method according to claim 1, wherein the flexographic printing plate further contains an emulsifier.

4. The manufacturing method according to claim 3, wherein the emulsifier is an anionic surfactant.

5. The manufacturing method according to claim 1, wherein the latex has the gelation degree of not less than 70% by mass.

6. The manufacturing method according to claim 1, wherein the amino-modified silicone compound having amino group equivalent of 1800 g/mol to 20,000 g/mol.

7. The manufacturing method according to claim 1, wherein the amino-modified silicone compound having amino group equivalent of 1800 g/mol to 10,000 g/mol.

* * * * *